US007192019B2

(12) United States Patent
Ryu et al.

(10) Patent No.: US 7,192,019 B2
(45) Date of Patent: Mar. 20, 2007

(54) PALLET AND METHOD FOR TRANSFERRING THE SAME

(75) Inventors: Joong-young Ryu, Cheonan-si (KR); Yong-hwa Chong, Cheonan-si (KR); Sung-woo Kim, Asan-si (KR); Young-il Ban, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 11/130,705

(22) Filed: May 17, 2005

(65) Prior Publication Data

US 2006/0066344 A1 Mar. 30, 2006

(30) Foreign Application Priority Data

Sep. 25, 2004 (KR) ..................... 10-2004-0077579

(51) Int. Cl.
*B23Q 3/00* (2006.01)
*G01R 31/00* (2006.01)
*G01R 31/28* (2006.01)

(52) U.S. Cl. ................................. 269/289 R; 324/770

(58) Field of Classification Search ..................... None
See application file for complete search history.

(56) References Cited

U.S. PATENT DOCUMENTS 6,597,970 B1 * 7/2003 Steury et al. ............... 700/242
6,672,356 B1 * 1/2004 Jenkins et al. .............. 156/540

* cited by examiner

*Primary Examiner*—Ha Tran Nguyen
*Assistant Examiner*—Trung Q. Nguyen
(74) *Attorney, Agent, or Firm*—Cantor Colburn LLP

(57) ABSTRACT

A pallet capable of fixing display panels having various sizes substantially normal to the pallet, a method of fixing the display panels using the pallet, and a method of transferring the pallet are provided. The pallet includes a first supporting unit and a second supporting unit for fixing a display panel, first panel fixing units included in both the first supporting unit and the second supporting unit, the first panel fixing units support a lower end of the display panel, and one or more second panel fixing units included in the first supporting unit and/or the second supporting unit. The one or more second panel fixing units are made of a plurality of disks for fixing at least one of opposing sides of the display panel.

12 Claims, 5 Drawing Sheets

PALLET AND METHOD FOR TRANSFERRING THE SAME

This application claims priority from Korean Patent Application No. 10-2004-0077579 filed on Sep. 25, 2004, in the Korean Intellectual Property Office, the disclosure of which is incorporated herein by reference in its entirety.

BACKGROUND OF THE INVENTION

1. Field of the Invention

The present invention relates to a pallet and a method for transferring the same, and more particularly, to a pallet capable of fixing a display panel having various sizes in a perpendicular direction to the pallet and a method for transferring the pallet.

2. Description of the Related Art

Electronic display devices play increasingly important roles in this information society and have been widely used in a variety of industrial fields.

Recently, there has been a trend towards increasing the sizes of televisions, or the like, and the panel sizes of display devices (hereinafter referred to as a display panel) such as a cathode ray tube (CRT), a liquid crystal display (LCD), a plasma display panel (PDP), or an organic electroluminescent display (OELD) have changed in various ways.

A multilevel test, such as an aging test, for example, is conducted on the above-described display panels in a method of manufacturing the same. The aging test checks for changes in operation characteristics of the display panel that occur with the passing of time. The aging test generally checks how a characteristic of the display panel changes when an image is displayed on the display panel under high temperature conditions. The display panel rests on a pallet while conducting the aging test.

Whenever the size of a display panel is changed when such a multilevel test is conventionally conducted, a pallet has to be replaced. For this reason, workplace efficiency is reduced, productivity is reduced, and the cost of production is increased.

Further, the display panel rests on the conventional pallet in a state such that the display panel is inclined at an angle of 75 degrees while the multilevel test is conducted on the display panel. In a case where a viewing angle test is conducted on a panel of an LCD that rests on the conventional pallet as described above, it is difficult to conduct the viewing angle test at a general television-watching angle.

SUMMARY OF THE INVENTION

The present invention provides a pallet capable of fixing a display panel having various sizes in a direction perpendicular to the pallet.

The present invention also provides a method of fixing the display panel on the pallet.

Further, the present invention provides a method of transferring the pallet.

In accordance with an aspect of the present invention, a pallet comprises a first supporting unit and a second supporting unit for fixing a display panel, first panel fixing units are included in both the first supporting unit and the second supporting unit to support a lower end of the display panel, and one or more second panel fixing units are included in the first supporting unit and/or the second supporting unit. The one or more second panel fixing units are made of a plurality of disks for fixing at least one of opposing sides of the display panel.

In accordance with another aspect of the present invention, a pallet comprises a first supporting unit and a second supporting unit for fixing a display panel, first panel fixing units are included in both the first supporting unit and the second supporting unit to support a lower end of the display panel, one or more second panel fixing units are included in the first supporting unit and/or the second supporting unit. The one or more second panel fixing units are made of a plurality of disks for fixing at least one of two sides of the display panel. A moving unit is included which makes the first supporting unit and/or the second supporting unit movable.

In accordance with still another aspect of the present invention, a method for fixing a display panel on a pallet is disclosed. The method comprises locating a lower end of the display panel on first panel fixing units included in a first supporting unit and a second supporting unit of the pallet, and disposing at least one of opposing sides of the display panel between a plurality of disks of one or more second panel fixing units included in the first supporting unit and/or the second supporting unit.

In accordance with a further aspect of the present invention, a method for fixing a display panel on a pallet is disclosed. The method comprises moving a moving unit connected to a first supporting unit and/or a second supporting unit of the pallet in order to move the first supporting unit and/or the second supporting unit according to a size of the display panel, locating a lower end of the display panel on first panel fixing units included in the first supporting unit and the second supporting unit of the pallet, and disposing at least one of opposing sides of the display panel between a plurality of disks of one or more second panel fixing units included in the first supporting unit and/or the second supporting unit.

In accordance with another aspect of the present invention, a method for transferring a pallet is disclosed. The method comprises locating a lower end of a display panel on first panel fixing units included in a first supporting unit and a second supporting unit of the pallet, and disposing at least one of opposing sides of the display panel between a plurality of disks of one or more second panel fixing units included in the first supporting unit and/or the second supporting unit to fix the display panel on the pallet, and mounting the pallet, on which the display panel is fixed, on a transfer device.

In accordance with another aspect of the present invention, a method for transferring a pallet is disclosed. The method comprises moving a moving unit connected to a first supporting unit and/or a second supporting unit of the pallet in order to move the first supporting unit and/or the second supporting unit according to a size of a display panel, and then locating a lower end of the display panel on first panel fixing units included in the first supporting unit and the second supporting unit of the pallet, and disposing at least one of opposing sides of the display panel between a plurality of disks of one or more second panel fixing units included in the first supporting unit and/or the second supporting unit to fix the display panel on the pallet, and mounting the pallet, on which the display panel is fixed, on a transfer device.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
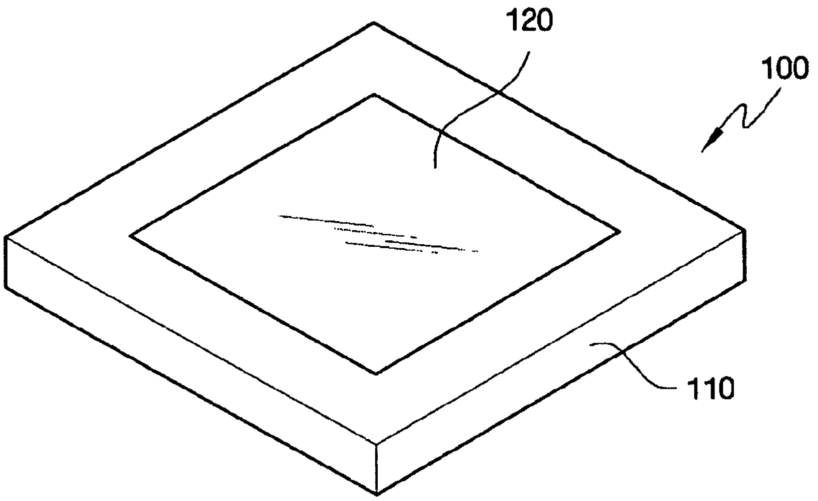
FIG. 1 is a perspective view of a display panel, which is fixed on and transferred by a pallet according to the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Hereinafter, embodiments of the present invention will be described in detail with reference to FIGS. 1 to 6. FIG. 1 is a perspective view of a display panel, which is fixed on a pallet and transferred by the pallet according to the present invention. The "display panel" means a panel of a display device such as a cathode ray tube (CRT), a liquid crystal display (LCD), a plasma display panel (PDP), or an organic electroluminescent display (OELD).

As shown in FIG. 1, a display panel 100 includes a case 110 and a screen unit 120 contained by the case 110. Further, a power supply terminal (not shown) for applying an external power supply to the screen unit 120 and a signal connector (not shown) for connecting an image signal, etc. from the outside are located on the back of the display panel 100.

Figure 2A:
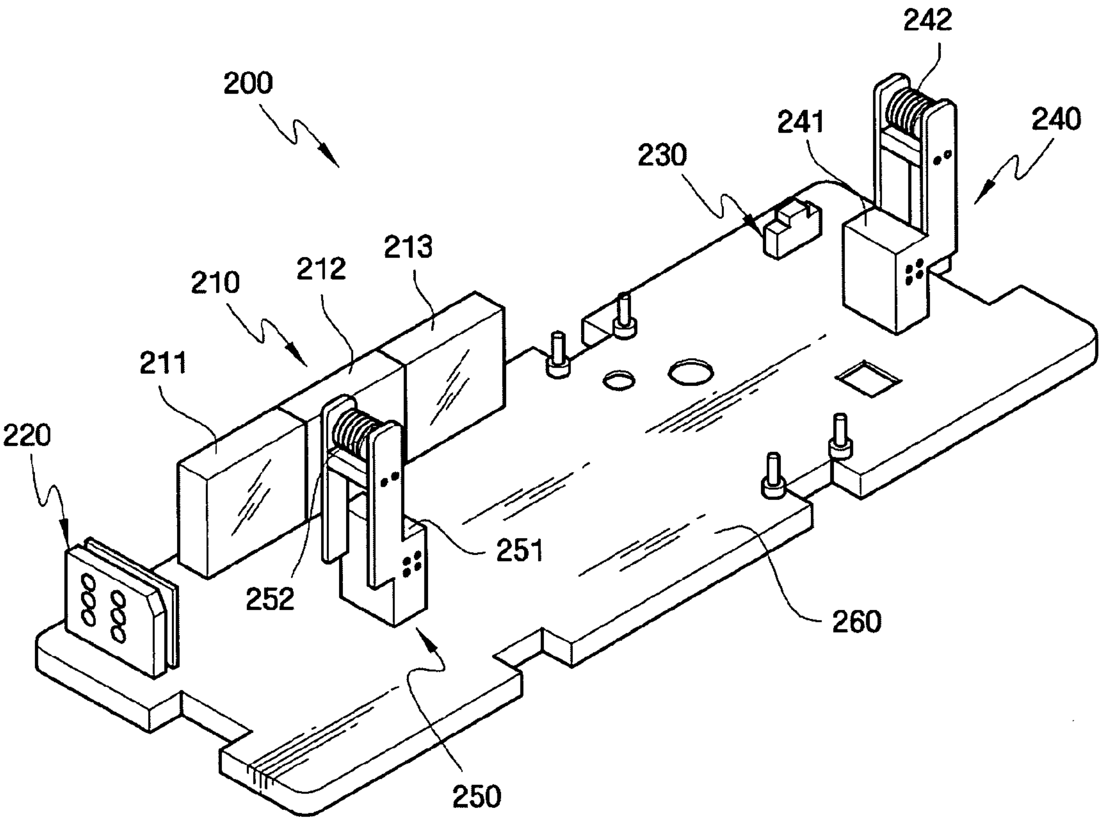
FIG. 2A is a perspective view of a pallet according to a first embodiment of the present invention.

FIG. 2A is a perspective view of a pallet according to a first embodiment of the present invention. The display panel 100 as shown in FIG. 1 is fixed on a pallet 200 and transferred by the pallet 200 shown in FIG. 2A according to the first embodiment of the present invention. The pallet 200 according to the first embodiment of the present invention includes a driving unit 210, a power supply applying unit 220, a signal applying unit 230, a first supporting unit 240, a second supporting unit 250 and a pedestal 260.

Referring to FIG. 2A, the driving unit 210 is installed to connect an external power supply and an external signal applied from the outside. The driving unit 210 may be made of one block, or preferably, of a plurality of blocks 211, 212, and 213. The plurality of blocks 211, 212, and 213 constituting the driving unit 210 are detachable assembly blocks. The power supply terminal and the signal connector located on the back of the display panel 100 (both not shown in FIG. 1) can be connected to each of the plurality of blocks 211, 212, and 213 of the driving unit 210. In the driving unit 210 made of the plurality of blocks 211, 212 and 213 as described above, each block has a different function. Thus, when a new function is required for the driving unit 210, a new block necessary for the new function can be easily assembled so that the new function can be supplemented in the driving unit 210. Further, if there is something wrong with one of the blocks of the driving unit 210, the single corresponding block can be replaced. Thus, when problems occur in the driving unit 210, the problems can be solved rapidly.

The external power supply and the external signal applied to the driving unit 210 are very weak signals that are generally transmitted from a computer. Thus, the power supply applying unit 220 and the signal applying unit 230 for amplifying and transmitting the above-described signals are located between the driving unit 210 and the power supply terminal and the signal connector of the display panel 100 shown in FIG. 1.

A power supply necessary for driving the display panel 100 is provided by the power supply applying unit 220 of the pallet 200. In addition, information on driving of the display panel 100, for example, signals such as clock/synchronism/timing information of the display panel, voltage/current limit, display time information, display pattern information, driving on/off time and power sequence, is applied to the display panel 100 by the signal applying unit 230 of the pallet 200.

According to the first embodiment of the present invention, the first supporting unit 240 and the second supporting unit 250 of the pallet 200 include first panel fixing units 241 and 251 for supporting a lower end of the display panel 100. Further, the first supporting unit 240 and the second supporting unit 250 can include second panel fixing units made of a plurality of disks for fixing opposite sides of the display panel 100. In this case, the second panel fixing unit can be included in either the first supporting unit 240 or the second supporting unit 250, or in both the first supporting unit 240 and the second supporting unit 250. FIG. 2A shows a case where both the first supporting unit 240 and the second supporting unit 250 each include second panel fixing units 242 and 252, respectively.

The first supporting unit 240 and the second supporting unit 250 are fixed on the pedestal 260. The first supporting unit 240 and the second supporting unit 250 include the first panel fixing units 241 and 251, respectively, to fix the lower end of the display panel 100 on the pallet 200.

Figure 2B:
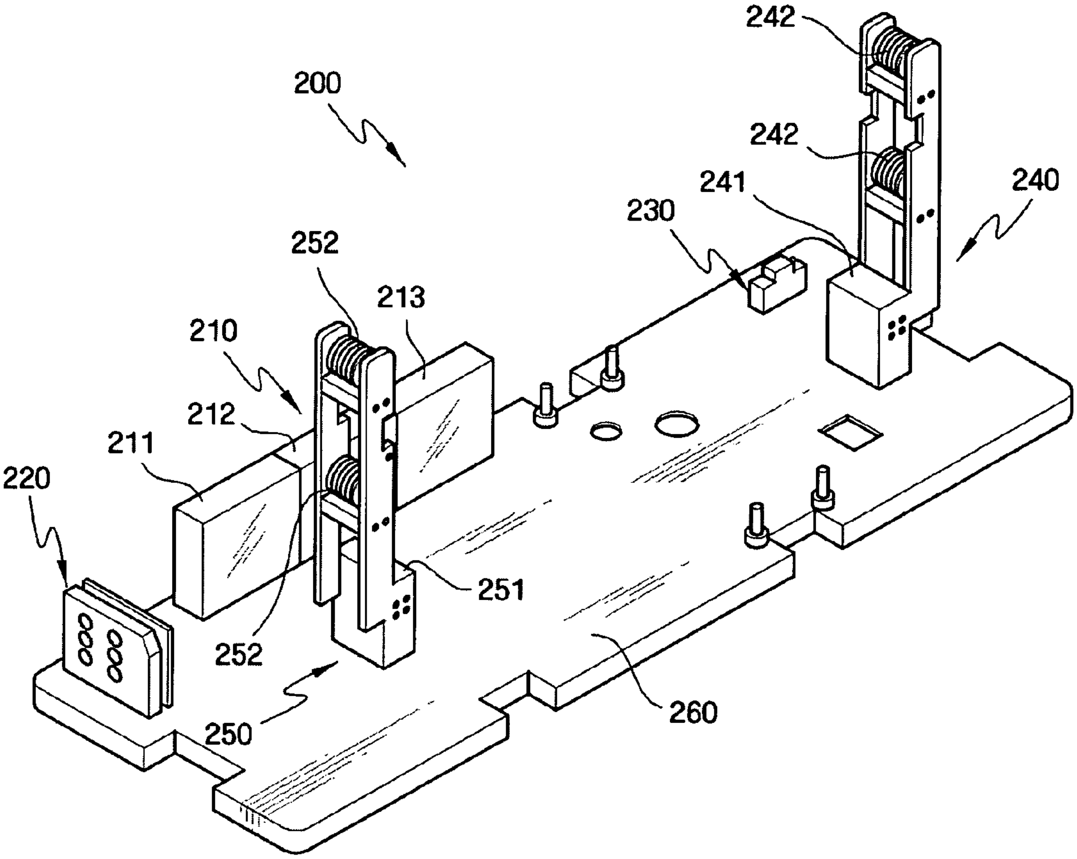
FIG. 2B is a perspective view showing a case where the pallet according to the first embodiment of the present invention has one or more second panel fixing units.

In addition, the first supporting unit 240 and the second supporting unit 250 include the second panel fixing units 242 and 252, respectively. The number of each of the second panel fixing units 242 and 252, as shown in FIG. 2A, can be one, or can be more than one, as shown in FIG. 2B. The number of each of the second panel fixing units 242 and 252 is determined by the size of the display panel 100 to be fixed. If the display panel 100 is large, the number of each of the second panel fixing units 242 and 252 is increased and the second panel fixing units 242 and 252 are separated from each other by a predetermined space so that the display panel 100 is fixed on the pallet 200.

Figure 3:
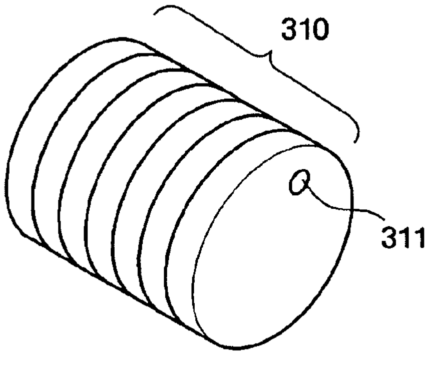
FIG. 3 is a perspective view of a plurality of disks included in the second panel fixing units of the pallet according to the first embodiment of the present invention.

Further, the second panel fixing units 242 and 252 each include a plurality of disks 310 (FIG. 3). Shapes of the disks 310 are not limited, and may be circular or oval. It is preferable that the sum of the widths of the disks included in the second panel fixing units 242 and 252 is larger than a thickness defined by opposing surfaces of the display panel

100 for fixing the display panel 100. FIG. 3 is a perspective view of the plurality of disks 310 included in each of the second panel fixing units 242, 252 of the pallet 200 according to the first embodiment of the present invention.

Each of the plurality of disks 310 have a connecting pivot 311 disposed thereon and connected to one another. The connecting pivots 311 are connected to one another, thereby allowing the plurality of disks 310 to be located on the first supporting unit 240 (see FIGS. 2A and 2B) and the second supporting unit 250 (see FIGS. 2A and 2B). Each of the plurality of disks 310 can rotatably move with respect to the connecting pivots 311.

Figure 4:
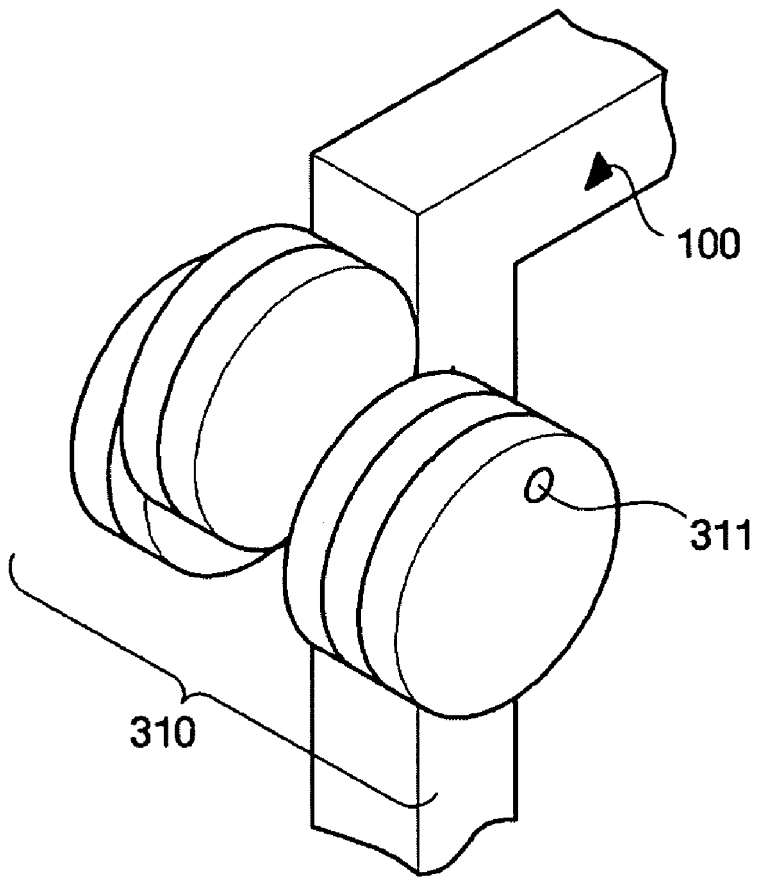
FIG. 4 shows a position of each of the plurality of disks included in the second panel fixing units when the display panel is fixed on the pallet according to the first embodiment of the present invention.

FIG. 4 shows displacement of the plurality of disks 310 included in the second panel fixing units 242 and 252 (see FIGS. 2A and 2B) when the display panel 100 rests on the pallet 200 (see FIGS. 2A and 2B) according to the first embodiment of the present invention. Referring to FIG. 4, when the display panel 100 is fixed on the second panel fixing units 242 and 252, the disks 310 disposed in a position corresponding to the width of the display panel 100 rotate about the connecting pivots 311 and are pivotably displaced outside of the remaining serially arranged disks 310. The remaining disks 310 do not move and prevent the display panel 100 from moving or shaking back and forth and fix the display panel 100 in a direction perpendicular to the pedestal 260.

Thus, since the second panel fixing units 242 and 252 include the plurality of disks 310 as described above, the display panel 100 can be transferred using one pallet 200 irrespective of the thickness of the display panel 100. Further, since the plurality of disks 310 of the second panel fixing units 242 and 252 perpendicularly fix the display panel 100 on the pallet 200, it is easy to conduct a viewing angle test at a television-watching angle without special operations.

Figure 5:
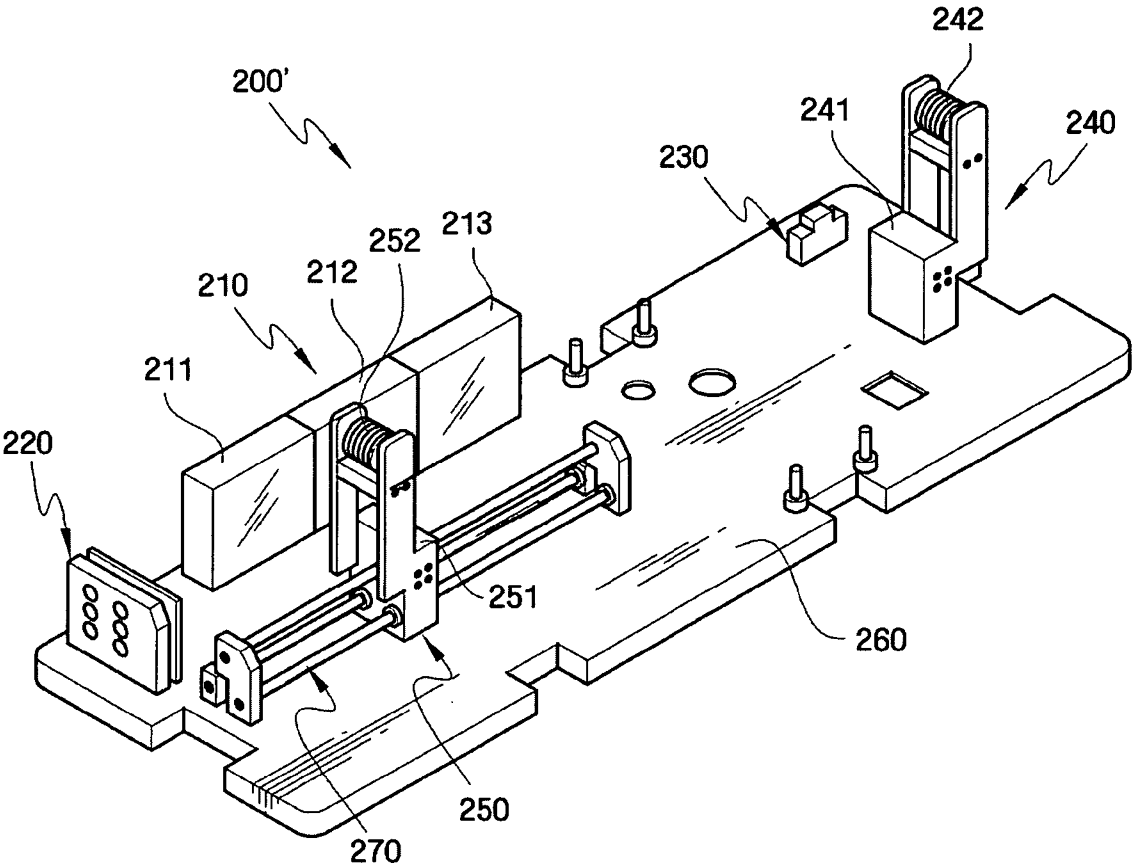
FIG. 5 is a perspective view of a pallet according to a second embodiment of the present invention.

FIG. 5 is a perspective view of a pallet according to a second embodiment of the present invention. The pallet 200" according to the second embodiment of the present invention includes a driving unit 210, a power supply applying unit 220, a signal applying unit 230, a first supporting unit 240, a second supporting unit 250, a pedestal 260, and a moving unit 270. The driving unit 210, the power supply applying unit 220, the signal applying unit 230, the first supporting unit 240, and the pedestal 260 included in the pallet 200' according to the second embodiment of the present invention are the same as those included in the pallet according to the first embodiment of the present invention.

In the pallet 200' according to the second embodiment of the present invention, the second supporting unit 250 included therein is linearly aligned with respect to the first supporting unit 240. Further, the second supporting unit 250 includes a first panel fixing unit 251 for supporting the lower end of the display panel 100 (see FIG. 1) and a second panel fixing unit 252 having a plurality of disks 310 (see FIG. 3) for fixing any one of opposing sides of the display panel 100. In a case where the first supporting unit 240 includes a second panel fixing unit 242, the second supporting unit 250 may not include the second panel fixing unit 252.

The moving unit 270 can be connected to the second supporting unit 250, and this enables the second supporting unit 250 to move according to changes in the size of the display panel 100.

The moving unit 270 is connected to the second supporting unit 250 so that the second supporting unit 250 can move according to the size of the display panel 100 using the moving unit 270. The moving unit 270 may move by sliding, however it is not limited to this method of movement specifically. Although the size of the display panel 100 may change, the second supporting unit 250 connected to the moving unit 270 moves according to the change in size of the display panel 100, and the display panel 100 can be transferred by one pallet 200' irrespective of the size of the display panel 100.

Figure 6:
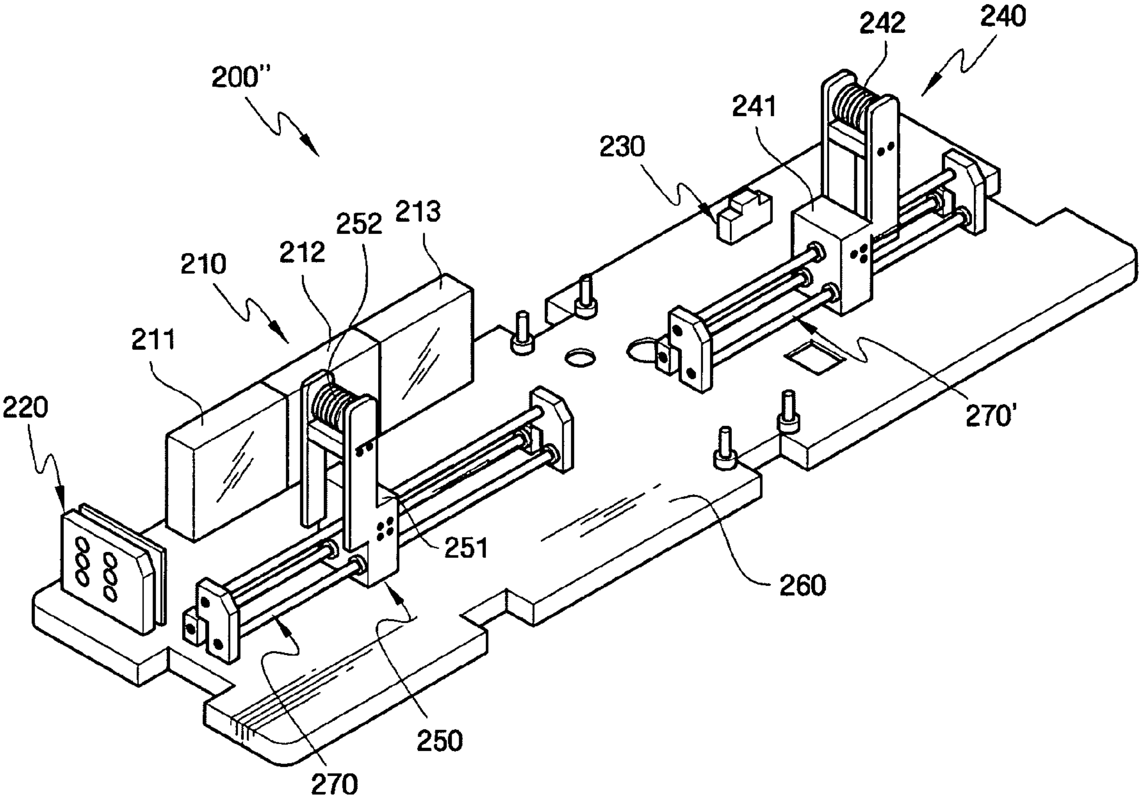
FIG. 6 is a perspective view of a pallet according to a third embodiment of the present invention.

FIG. 6 is a perspective view of a pallet according to a third embodiment of the present invention. The pallet 200" according to the third embodiment of the present invention includes a driving unit 210, a power supply applying unit 220, a signal applying unit 230, a first supporting unit 240, a second supporting unit 250, a pedestal 260, and moving units 270 and 270'. The driving unit 210, the power supply applying unit 220, the signal applying unit 230, the second supporting unit 250, the pedestal 260, and the moving unit 270 included in the pallet 200" according to the third embodiment of the present invention are the same as those included in the pallet according to the second embodiment of the present invention.

The first supporting unit 240 included in the pallet 200" according to the third embodiment of the present invention is linearly aligned with respect to the second supporting unit 250. Further, the first supporting unit 240 includes a first panel fixing unit 241 for supporting the lower end of the display panel 100 (see FIG. 1) and a second panel fixing unit 242 having a plurality of disks 310 (see FIG. 3) for fixing any one of opposing sides of the display panel 100. In a case where the second supporting unit 250 includes a second panel fixing unit 252, the first supporting unit 240 may not include the first panel fixing unit 242.

The moving unit 270' can be connected to the first supporting unit 240, and this enables the first supporting unit 240 to move according to changes in the size of the display panel 100.

The moving unit 270' is connected to the first supporting unit 240 so that the first supporting unit 240 can move according to the size of the display panel 100 using the moving unit 270'. The moving unit 270' may move by sliding, however it is not limited to this method of movement specifically. Although the display panel 100 may have different sizes, the first supporting unit 240 connected to the moving unit 270' and the second supporting unit 250 connected to the moving unit 270 move together according to the size of the display panel 100, and the display panel 100 can be transferred by using one pallet 200" irrespective of the size of the display panel 100.

Hereinafter, methods of fixing the display panel having various sizes on the pallets according to the embodiments of the present invention will be explained.

A method of fixing the display panel on the pallet 200 according to the first embodiment of the present invention will be described below. Referring to FIG. 2A, first, the lower end of the display panel 100 (see FIG. 1) is located on the respective first panel fixing units 241 and 251 of the first and second supporting units 240 and 250, respectively, of the pallet 200. Subsequently, opposite surfaces defining a thickness of the display panel 100 (see FIG. 4) are pushed between the plurality of disks 310 (see FIG. 4) of one or more second panel fixing units 242 and 252 of the first and second supporting units 240 and 250 so that the display panel 100 is fixed on the pallet 200.

A method for fixing the display panel on the pallet 200' according to the second embodiment of the present invention will now be described. Referring to FIG. 5, first, the moving unit 270 connected to the second supporting unit 250 of the pallet 200' moves so that the second supporting unit 250 moves according to the size of the display panel 100

(see FIG. 1). Subsequently, the lower end of the display panel 100 is located on the respective first panel fixing units 241 and 251 of the first and second supporting units 240 and 250, respectively, of the pallet 200'. Continuously, opposing surfaces defining a thickness of the display panel 100 (see FIG. 4) are pushed between the plurality of disks 310 (see FIG. 4) of one or more second panel fixing units 242 and 252 of the first and second supporting units 240 and 250 so that the display panel 100 is fixed on the pallet 200'.

A method for fixing the display panel on the pallet according to the third embodiment of the present invention will now be described. Referring to FIG. 6, first, the moving units 270' and 270 that are respectively connected to the first and second supporting units 240 and 250 of the pallet 200" move so that the first and second supporting units 240 and 250 also move according to the size of the display panel 100 (see FIG. 1). Subsequently, the lower end of the display panel 100 is located on the first panel fixing units 241 and 251 of the first and second supporting units 240 and 250, respectively, of the pallet 200". Continuously, opposing surfaces defining a thickness of the display panel 100 (see FIG. 4) are pushed between the plurality of disks 310 (see FIG. 4) of one or more second panel fixing units 242 and 252 of the first and second supporting units 240 and 250 so that the display panel 100 is fixed on the pallet 200".

Hereinafter, methods for transferring the pallets after fixing the display panels having various sizes on the pallets according to the embodiments of the present invention will be explained.

First, a method for transferring the pallet after fixing the display panel on the pallet according to the first embodiment of the present invention will now be described. Referring to FIG. 2A, first, the lower end of the display panel 100 (see FIG. 1) is located on the first panel fixing units 241 and 251 of the first and second supporting units 240 and 250 of the pallet 200. Then, opposing surfaces defining a thickness of the display panel 100 (see FIG. 4) are disposed between the plurality of disks 310 (see FIG. 4) of one or more second panel fixing units 242 and 252 of the first and second supporting units 240 and 250, respectively, so that the display panel 100 is fixed on the pallet 200. Subsequently, the pallet 200, on which the display panel 100 is fixed, is mounted on a transfer device such as a conveyor belt so that the pallet 200 having the display panel 100 are transferred.

A method for transferring the pallet after fixing the display panel on the pallet according to the second embodiment of the present invention will now described. Referring to FIG. 5, first, the moving unit 270 connected to the second supporting unit 250 of the pallet 200' moves so that the second supporting unit 250 moves according to the size of the display panel 100 (see FIG. 1). Then, the lower end of the display panel 100 is located on the first panel fixing units 241 and 251 of the first and second supporting units 240 and 250, respectively, of the pallet 200'. Opposing surfaces defining a thickness of the display panel 100 (see FIG. 4) are pushed between the plurality of disks 310 (see FIG. 4) of one or more second panel fixing units 242 and 252 of the first and second supporting units 240 and 250, respectively, so that the display panel 100 is fixed on the pallet 200'. Subsequently, the pallet 200', on which the display panel 100 is fixed, is mounted on a transfer device such as a conveyor belt so that the pallet 200' having the display panel 100 are transferred.

A method for transferring the pallet after fixing the display panel on the pallet according to the third embodiment of the present invention will now be described. Referring to FIG. 6, first, the moving units 270' and 270 that are respectively connected to the first and second supporting units 240 and 250 of the pallet 200" move so that the first and second supporting units 240 and 250 are positioned according to the size of the display panel 100 (see FIG. 1). Then, the lower end of the display panel 100 is located on the first panel fixing units 241 and 251 of the first and second supporting units 240 and 250 of the pallet 200". Opposing surfaces defining a thickness of the display panel 100 (see FIG. 4) are pushed between the plurality of disks 310 (see FIG. 4) of one or more second panel fixing units 242 and 252 of the first and second supporting units 240 and 250, respectively, so that the display panel 100 is fixed on the pallet 200". Subsequently, the pallet 200", on which the display panel 100 is fixed, is mounted on a transfer device such as a conveyor belt so that the pallet 200" having the display panel 100 are transferred.

As described above, the pallet according to the present invention and the method for transferring the same have one or more effects or advantages that will be described below.

First, since the pallet according to the present invention has one or more second panel fixing units that include a plurality of disks, it is possible to fix and transfer a display panel using one pallet irrespective of the thickness of the display panel.

Second, since the pallet according to the present invention has one or more second panel fixing units that include the plurality of disks, the display panel can be fixed perpendicularly so that it is easy to conduct a viewing angle test in a television-watching direction.

Third, since the pallet according to the present invention has a movable first supporting unit and/or a movable second supporting unit, it is possible to fix and transfer a display panel using one pallet irrespective of the size (e.g., width and length) of the display panel.

Fourth, since the display panel, as described above, can be transferred using one pallet according to the present invention irrespective of the thickness and the size of the display panel, process efficiency can be increased.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A pallet comprising:

a first supporting unit and a second supporting unit for fixing a display panel;

first panel fixing units included in both the first supporting unit and the second supporting unit, the first panel fixing units support a lower end of the display panel; and one or more second panel fixing units included in at least one of the first supporting unit and the second supporting unit, the one or more second panel fixing units are made of a plurality of disks fixing at least one of opposing sides of the display panel.

2. The pallet of claim 1, wherein the disks of the second panel fixing units included in at least one of the first supporting unit and the second supporting unit have connecting pivots connected to one another disposed thereon, each of the disks rotatably movable about the connecting pivots.

3. The pallet of claim 1, wherein the sum of the widths of the plurality of disks constituting each of the second panel fixing units included in the at least one of the first supporting unit and the second supporting unit is larger than a thickness defined by opposing surfaces of the display panel.

4. The pallet of claim 1, further comprising:

a driving unit which is electrically connected to the display panel and to which an external signal and an external power supply are connected;

a power supply applying unit which is connected to the driving unit and applies the external power supply to the display panel; and a signal applying unit which is connected to the driving unit and applies the external signal to the display panel.

5. The pallet of claim 4, wherein the driving unit includes a plurality of detachable assembly blocks.

6. The pallet of claim 4, wherein the respective plurality of blocks of the driving unit have different functions.

7. A pallet comprising:

a first supporting unit and a second supporting unit for fixing a display panel;

first panel fixing units included in both the first supporting unit and the second supporting unit, the first panel fixing units support a lower end of the display panel;

one or more second panel fixing units included in at least one of the first supporting unit and the second supporting unit, the one or more second panel fixing units are made of a plurality of disks for fixing at least one of opposing sides of the display panel; and a moving unit which makes the at least one of the first supporting unit and the second supporting unit movable.

8. The pallet of claim 7, wherein the disks of the second panel fixing units included in the at least one of the first supporting unit and the second supporting unit have connecting pivots connected to one another disposed thereon, each of the disks are rotatably movable about the connecting pivots.

9. The pallet of claim 7, wherein the sum of the widths of the plurality of disks constituting each of the second panel fixing units included in the at least one of the first supporting unit and the second supporting unit is larger than a thickness defined by opposing surfaces of the display panel.

10. The pallet of claim 7, further comprising:

a driving unit which is electrically connected to the display panel and to which an external signal and an external power supply are connected;

a power supply applying unit which is connected to the driving unit and applies the external power supply to the display panel; and a signal applying unit which is connected to the driving unit and applies the external signal to the display panel.

11. The pallet of claim 10, wherein the driving unit includes a plurality of detachable assembly blocks.

12. The pallet of claim 10, wherein the respective plurality of blocks of the driving unit have different functions.

* * * * *